United States Patent [19]
Decker et al.

[11] Patent Number: 6,110,576
[45] Date of Patent: Aug. 29, 2000

[54] ARTICLE COMPRISING MOLDED CIRCUIT

[75] Inventors: Robert L. Decker, Parsippany; John D. Weld, Succasunna, both of N.J.

[73] Assignee: Lucent Technologies Inc., Murray Hill, N.J.

[21] Appl. No.: 09/173,502

[22] Filed: Oct. 16, 1998

[51] Int. Cl.[7] .................................................. B32B 5/06
[52] U.S. Cl. ........................... 428/300.1; 428/300.7; 428/301.1; 428/412; 428/413; 428/414; 428/425.9; 428/901; 174/257; 174/258; 361/792; 361/794; 361/795
[58] Field of Search .................... 428/425.9, 300.1, 428/300.7, 301.1, 301.4, 412–414, 901; 174/257, 258, 255; 361/792, 794, 795, 780

[56] References Cited

U.S. PATENT DOCUMENTS

| | | | |
|---|---|---|---|
| 3,978,378 | 8/1976 | Tigner et al. | 174/257 |
| 4,189,524 | 2/1980 | Lazzari | 174/257 |
| 4,710,419 | 12/1987 | Gregory | 428/210 |
| 4,755,911 | 7/1988 | Suzuki | 174/258 |
| 5,136,123 | 8/1992 | Kobayashi et al. | 174/258 |
| 5,542,557 | 8/1996 | Koyama et al. | 215/347 |
| 5,571,991 | 11/1996 | Highum et al. | 174/35 MS |
| 5,574,630 | 11/1996 | Kresge et al. | 174/258 |

*Primary Examiner*—Cathy F. Lam
*Attorney, Agent, or Firm*—Mathews, Collins, Sheperd & Gould, P.A.

[57] ABSTRACT

An article comprising a molded circuit for providing a path for electrical current is disclosed. The molded circuit is formed of a first material layer and a second material layer. The first material layer is an electrically insulating material. The second material layer is an electrically conductive material. In an alternate embodiment, the second material layer is surrounded between two layers of the first material layer. The molded circuit can be formed using multi-material injection molding such as co-injection molding or two-shot injection molding. A printed circuit board can comprise the molded circuit.

18 Claims, 7 Drawing Sheets

ARTICLE COMPRISING MOLDED CIRCUIT

FIELD OF THE INVENTION

The present invention relates generally to articles comprising molded circuits which provide a path for an electrical current and, more particularly, to molded circuits formed of an electrically conductive thermoplastic polymeric material useful as molded power planes, ground planes and as signal circuits for connecting electronic components.

DESCRIPTION OF THE RELATED ART

Electronic devices are well known in the art. A typical electronic device can have a multi-component structure which includes, for example, a printed circuit board to which are mounted microprocessor chips, memory chips, filter capacitors, resistors and power supplies that are connected to each other, power sources and ground potential through electrically conductive paths. Conventional electrically conductive paths are formed of copper and gold.

Conventional printed circuit boards comprise flat laminates, typically epoxy glass, which have a conductive pattern formed thereon. The conductive pattern typically includes signal lines of thin traces of copper. The signal lines transmit electrical signals to various components mounted on the printed circuit board. Printed circuit boards can also include a power plane receiving power from power sources for powering mounted electronic components and a ground plane receiving power from the powered electronic components. Typical conventional power planes and ground planes are formed of a copper sheet. Numerous manufacturing steps are typically used and numerous steps in the application of circuit patterns are typically required to form conventional printed circuit boards and are well known to those skilled in the art, as described in C. F. Coombs, Jr. "Printed Circuits Handbook", 4th ed., McGraw Hill (1996).

A process for the manufacture of a molded printed circuit board, described in U.S. Pat. No. 4,710,419, places a conductive layer into the molding cavity of an injection mold. The conductive layer includes a thermoplastic backing which adheres to electrically insulated material injected into the mold. The conductive layer may be a patterned copper foil or plated with tin, lead, nickel and gold alone or in various combinations.

Injection molding processes are currently used to form housings for electronic devices. In a conventional injection molding process, a thermoplastic polymeric material is heated to a predetermined temperature to provide a polymer melt having a melt viscosity sufficient for fluid flow under pressure into a mold cavity. The heated thermoplastic polymeric material is injected into a closed mold cavity under high pressure to completely fill the mold cavity. Melt temperatures, viscosities, and pressures of thermoplastic polymeric materials are available as processing parameters from manufacturers of thermoplastic polymeric materials and are well known in the art. The mold cavity is provided at a temperature below the thermoplastic polymeric material melt temperature which returns the thermoplastic polymeric material to its original solidified state. The mold cavity is opened to release the thermoplastic polymeric material which has been formed into a shape defined by the mold cavity It is desirable to provide a molded circuit with a reduced number of manufacturing steps from moldable electrically conductive polymeric materials in an injection molding process.

SUMMARY OF THE INVENTION

The present invention is directed to a molded circuit useful for providing a path for electrical current of an electronic device. The molded circuit can be used as a housing of an electronic device comprising a printed circuit board in which elements of the conventional circuit board are transferred onto the housing, such elements include a power plane, ground plane, and signal circuits for connecting electrical components.

The molded circuit has a multi-layered structure which combines at least one electrically insulating material layer with at least one electrically conductive material layer. The material layers are selected to be compatible with injection molding processes. In one embodiment, the electrically conductive material layer is surrounded by two layers of the electrically insulating material.

The electrically insulating material layer is non-conductive to electricity. Suitable electrically insulating materials include thermoplastic polymeric materials that have a surface resistivity of greater than $10^{12}$ ohms/square and a volume resistivity of greater than $10^{13}$ ohm-centimeter. Examples of suitable thermoplastic materials include polycarbonate (PC), acrylonitrile-butadiene styrene (ABS) and blends (PC/ABS), polyamide nylon (PA), polyether imide (PEI), polyphenylene sulfide (PPS), polyvinyl acetate (PVA), polyethylene (PE), polypropylene (PP), polyvinylchloride (PVC) and polyvinylpyrolidone (PVP).

The electrically conductive material layer is an electrically conductive polymeric material. The electrically conductive material layer has a composition in which an electrically conductive additive is suspended within a thermoplastic polymeric material in an amount sufficient to provide electrical conductivity throughout the polymeric material. Suitable electrically conductive polymeric materials include thermoplastic polymeric materials that have a surface resistivity of less than about 10 ohms/square and a volume resistivity of less than about 2.0 ohm-centimeter. The concentration of the additive suspended in the thermoplastic polymeric material is selected to provide the surface resistivity and volume resistivity within the above-described range. Examples of suitable electrically conductive additives include metal coated graphite fibers such as, nickel-coated graphite (NiCG) fibers, nickel copper-coated graphite (NiCuCG) fibers, and nickel copper nickel-coated graphite (NiCuNiCG) fibers and metal fibers, such as nickel-coated copper (NiCCu) fibers, stainless steel (SS) fibers, and copper plated stainless steel (CuCSS) fibers. The suitable thermoplastic polymeric materials used in the electrically conductive material layer can be the same as the above-described thermoplastic materials used in the electrically insulating material layer. The thermoplastic polymeric material used in the electrically conductive material layer is selected to provide adhesion with the thermoplastic polymeric material used in the electrically insulating material layer.

It has been found that an electrically conductive additive in the form of a fiber having an aspect ratio of length to diameter in the range of about 100:1 to about 2000:1 in an amount of at least about 6% by weight of the polymeric material and no more than about 25% by weight of the polymeric material provides sufficient electrical conductivity of an injection molded article.

The molded circuit of the present invention is advantageously formed using an injection molding process. Preferably, the molded circuit is formed by a multi-material injection molding process, such as co-injection molding or multi-shot injection molding. In the conventional co-injection molding process, two thermoplastic polymeric materials are concurrently injected into a mold cavity under control of a co-injection molding machine with a co-injection nozzle to form an article. In the present invention, a first thermoplastic polymeric material is injected through the co-injection nozzle into the mold cavity to partially fill the mold cavity. The first thermoplastic polymeric material is an electrically insulating material to form the electrically insulating material layer. Thereafter, a second thermoplastic polymeric material is injected through the co-injection nozzle into the mold cavity. The second thermoplastic polymeric material is an electrically conductive material to form the electrically conductive material layer. The co-injection nozzle combines the second thermoplastic material with the first thermoplastic material to form a concentric polymeric melt with the first thermoplastic polymeric material surrounding the second thermoplastic polymeric material. The concentric polymeric melt is continuously injected until the mold cavity is filled. The second thermoplastic polymeric material layer surrounds the first thermoplastic polymeric material layer to form the molded article.

In the multi-shot injection molding process, such as two-shot injection molding, a first thermoplastic polymeric material is injected into a first mold cavity. The first thermoplastic polymeric material can be formed of either an electrically insulating material or an electrically conductive material. The mold cavity is opened retaining the partially molded part in the cavity and is sequenced for engagement with a second mold cavity. A second thermoplastic polymeric material is injected into the second cavity against the partially molded part. The second thermoplastic polymeric material is different from the first thermoplastic polymeric material and is either an electrically conductive material when the first thermoplastic polymeric material is an electrically insulating material or is an electrically insulating material when the first thermoplastic polymeric material is an electrically conductive material. The second thermoplastic polymeric material layer can cover either all or a portion of the first thermoplastic polymeric material layer. Conditions for injecting the first material and second material into the mold cavity in the co-injection and multi-shot injection molding are selected based upon melt temperature and viscosity of the materials, and are available as processing parameters from manufacturers of thermoplastic polymeric materials and are well known to those skilled in the art.

In an alternative embodiment, a printed circuit board can comprise the multi-layered molded circuit. In this embodiment, the multi-layered structure of the molded circuit is formed of at least one signal line layer, a plurality of electrically insulating layers and a plurality of electrically conductive layers.

Other objects and features of the present invention will become apparent from the following detailed description considered in conjunction with the accompanying drawings. It is to be understood, however, that the drawings are designed solely for purposes of illustration and do not serve to limit the invention, for which reference should be made to the appended claims.

DETAILED DESCRIPTION

Figure 1:
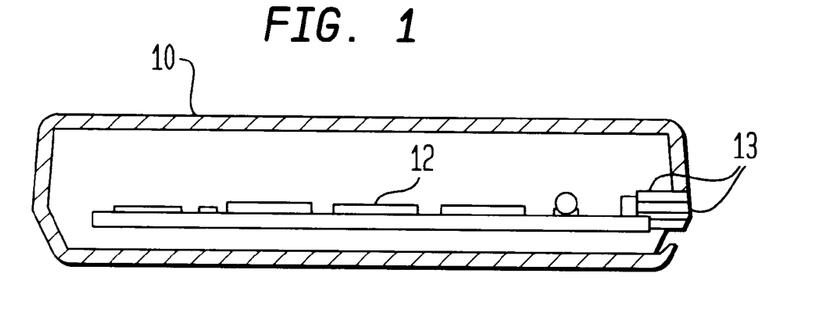
FIG. 1 is a cross-section of a molded circuit of the present invention including an electronic device housed within the molded circuit.

FIG. 1 illustrates a cross sectional view of molded circuit 10. Molded circuit 10 is useful as a housing for electronic device 12. Electronic device 12 has a multi-component structure which includes for example a printed circuit board. Connectors 13 connect electronic device 12 to molded circuit 10. Suitable connectors 13 include metal clamps, screws, fasteners or a similar conductive device. Molded circuit 10 provides one or more electrically conductive paths to electronic device 12. For example, the electrically conductive path can be a ground plane or power plane.

Figure 2:
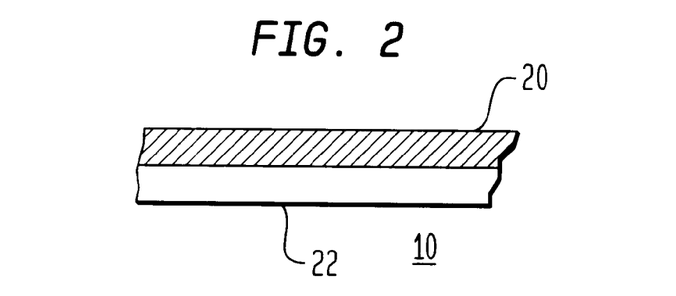
FIG. 2 is an enlarged cross-section of a portion of the molded circuit depicted in FIG. 1.

FIG. 2 is an enlarged cross section of a portion of molded circuit 10. Molded circuit 10 is formed of an electrically insulating material layer 20 and an electrically conductive material layer 22. Electrically insulating material layer 20 and electrically conductive material layer 22 are selected to be compatible with an injection molding process. Electrically insulating material layer 20 is a non-electrically conductive layer which electrically insulates electrically conductive material layer 22. Electrically conductive material layer 22 conducts electrical current by the suspension of electrically conductive additives. Electrically conductive material layer 22 provides a path for electrical current in molded circuit 10.

Electrically insulating material layer 20 has a surface resistivity of greater than about $10^{12}$ ohm/square and a volume resistivity of greater than about $10^{13}$ ohm-centimeter. Examples of thermoplastic polymeric materials suitable for use as electrically insulating material layer 20 are polycarbonate (PC), acrylonitrile-butadiene styrene (ABS), polycarbonate (PC) and acrylonitrile-butadiene styrene (ABS) blends (PC/ABS), polyamide nylon (PA), polyether imide (PEI), polyphenylene sulfide (PPS), polyvinyl acetate (PVA), polyethylene (PE), polypropylene (PP), polyvinylchloride (PVC) and polyvinylpyrolidone (PVP). It will be appreciated that other thermoplastic polymeric materials suitable for providing electrical insulation known in the art could be used with the teachings of the present invention.

Electrically conductive material layer 22 has a composition in which a conductive additive is suspended within a polymeric material in an amount sufficient to provide electrical conductivity. Electrically conductive material layer 22 has a surface resistivity of less than about 10 ohm/square and a volume resistivity of less than about 2.0 ohm-centimeter. Examples of suitable thermoplastic polymeric materials for use in electrically conductive material layer 22 include polycarbonate (PC), acrylonitrile-butadiene styrene (ABS), PC/ABS blends, polyamide nylon (PA) polyether imide (PEI), polyphenylene sulfide (PPS), polyvinyl acetate (PVA), polyethylene (PE), polypropylene (PP), polyvinylchloride (PVC) and polyvinylpyrolidone (PVP). Additives can be in the form of particles, flakes or fibers. Examples of suitable electrically conductive additives useful in this present invention include metal coated graphite fibers such as, nickel-coated graphite (NiCG) fibers, nickel coppercoated graphite (NiCuCG) fibers, and nickel copper nickel-coated graphite (NiCuNiCG) fibers and metal fibers, such as nickel-coated copper (NiCCu) fibers, stainless steel (SS) fibers, and copper plated stainless steel (CuCSS) fibers.

Conductive fibers typically have a graphite core with a diameter in the range of about 5 microns to about 10 microns and are coated with about 0.5 microns to about 3 microns thick layer of metal. Conductive fibers are generally bundled into about 3,000 to about 12,000 fiber rovings which are impregnated with a resin binder to hold the fibers together. The rovings are chopped into pellets having a length in the range of from about 0.125 inch to about 0.5 inch to be useful for dry-blending with thermoplastic polymeric materials. Suitable conductive additives include metal coated graphite fibers available commercially from Composite Materials, LLC, Mamaroneck, N.Y. nickel-coated graphite fibers available commercially from INCO Specialty Powder Products, Wyckoff, N.J. and stainless steel fibers available commercially from Bekaert Fibre Technologies, Marietta, Ga.

The amount of electrical conductivity of electrically conductive material layer 22 is dependent on the composition and amount of additive that is suspended within the polymeric material. It has been found that conductive fibers having an aspect ratio of the length to diameter in the range of about 100:1 to about 2000:1 in an amount of at least about 6% by weight and no greater than about 25% by weight suspended in the thermoplastic polymeric material are sufficient to provide electrical conductivity suitable for electrical currents. Preferably, the aspect ratio of the electrically conductive fiber is in the range of about 780:1 to about 820:1 in an amount in the range of about 10% to about 20% by weight suspended in the thermoplastic polymeric material. It is believed that having the aspect ratio in the range of about 780:1 to about 820:1 provides an increased probability that the fibers contact each other to form a path for electrical current through the polymeric material. Additionally, as the weight percentage of the additive that is suspended in the polymeric material is increased over a certain weight percent, about 25% by weight, the electrical conductivity of the corresponding material layer does not change significantly.

It has been determined that increased fiber length provides lower electrical resistance which is believed to be due to increased contact between fibers suspended in the polymeric material. However, increased fiber lengths may be unsuitable for molding thinner articles. For example, a fiber length in the range of about 0.125 inch to about 0.25 inch provides sufficient moldability for molded articles having a thickness in the range of about 0.025 inch to about 0.062 inches. A longer fiber length up to about 0.5 inches can be molded into an article having a thickness in the range of about 0.062 inches to about 0.125 inches.

A thickness of electrically conductive material layer 22 in a range of about 0.015 to about 0.050 inches provides an electrically conductive path for electrical current. The thickness of electrically insulating material layer 20 is largely a matter of design choice. Typically, the thickness of injection molded articles is generally less than about 0.125 inches.

Figure 3:
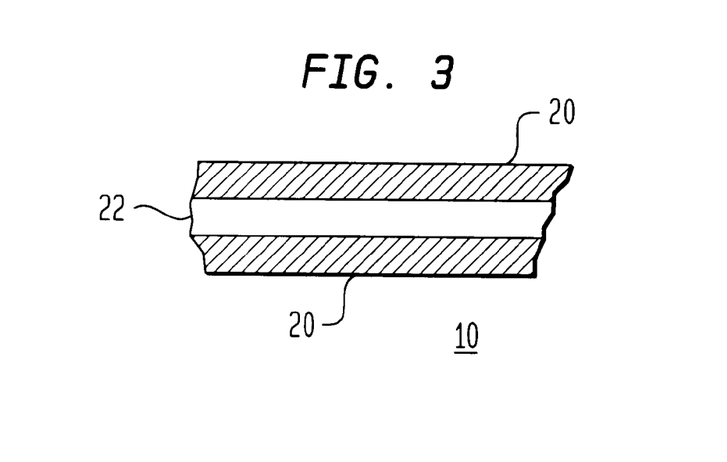
FIG. 3 is an enlarged cross-section of a portion of the molded circuit in which a second material layer is sandwiched between two layers of a first material.

Alternatively, molded circuit 10 has a structure in which electrically conductive material layer 22 is sandwiched between two layers of electrically insulating material layer 20, as shown in FIG. 3.

Figure 4:
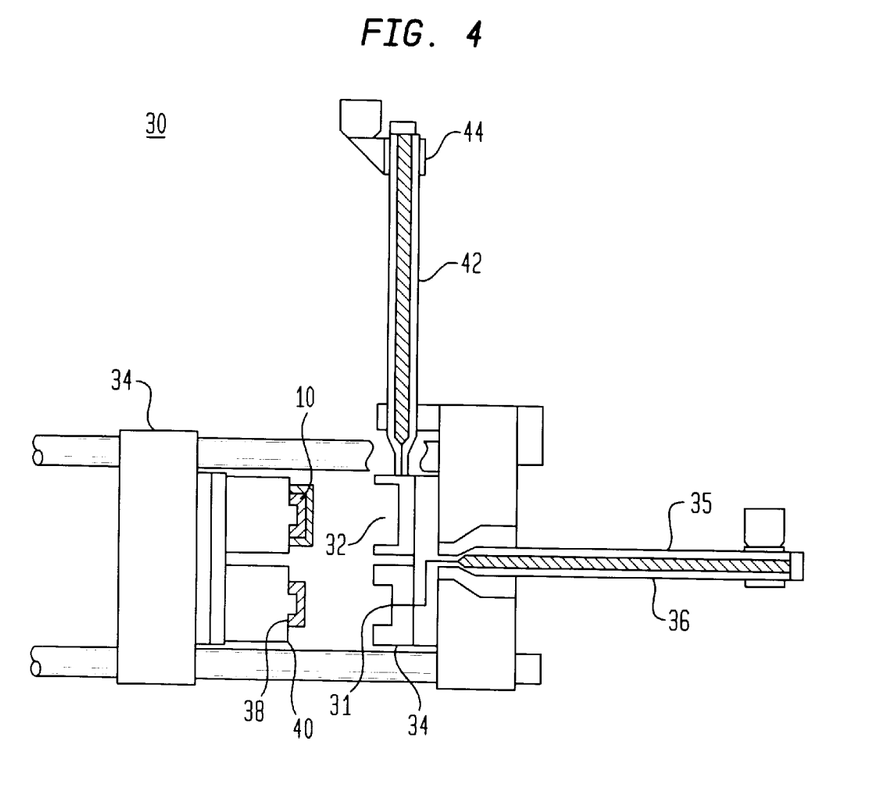
FIG. 4 is a schematic diagram of a multi-material injection molding process useful for making the molded article of the present invention.

Molded circuit 10 can be formed using a multi-shot injection molding process 30 (i.e., two-shot injection molding). First mold cavity 31 and second mold cavity 32 are mounted on rotary platen 34, as shown in FIG. 4. First material layer 35 is injected from first injection nozzle 36 into and completely fills first mold cavity 31. First material layer 35 can be formed of either electrically insulating material layer 20 or electrically conductive material layer 22. First mold cavity 31 is opened retaining first molded material 38 on surface 40 of first mold cavity 31. Channels and holes representing circuit paths and access points can be formed in first material layer 35. Surface 40 is rotated by rotary platen 34 for alignment with second mold cavity 32. Second material layer 42 is injected from second injection nozzle 44 to fill second mold cavity 32 and any channels and holes to complete molded circuit 10. Second material layer 42 is formed of a different type of material than first material layer 35, such that second material layer 42 is formed of electrically conductive material layer 22 when first material layer 35 is formed of electrically insulating material layer 20 and second layer 42 is formed of electrically insulating layer 20 when first material layer 35 is formed of electrically conductive material layer 22. A suitable multi-shot injection molding machine is available commercially from Engel Canada Inc., Guelph, Ontario, Canada and Battenfeld of America, Inc., West Warwick, Rhode Island.

Molded circuits 10 with three or more material layers are optionally formed by repeating the sequencing to mold additional layers alternating between either electrically insulating material layer 20 or electrically conductive material layer 22. Different shaped mold cavities can be sequenced to receive the additional layers of materials.

Figure 5A:
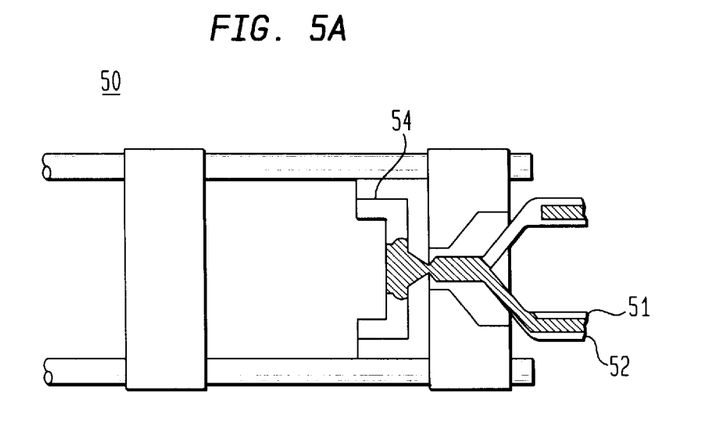
FIGS. 5A–C is a schematic diagram of co-injection molding process useful for making the molded article of the present invention.
Figure 5B:
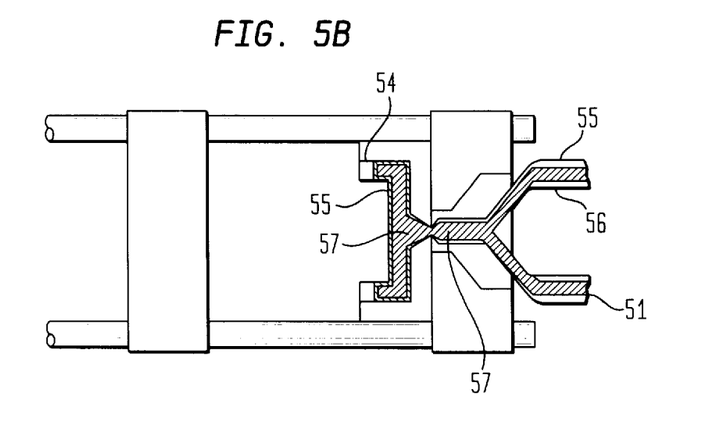
Figure 5C:
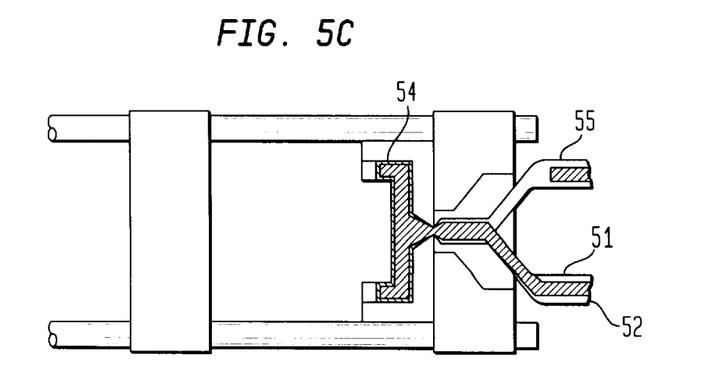

Alternatively, molded circuit 10 can be formed using a co-injection molding process resulting in a molded part with one component (core) completely surrounded by the other component (skin) throughout its cross section. For example, the core layer can be formed of an electrically conductive material to be used as a ground plane or power plane which is surrounded by a non-electrically conductive insulation layer. FIGS. 5A–5B illustrate schematic diagrams of a co-injection molding process 50. First material layer 51 is injected from first injection nozzle 52 to partially fill mold cavity 54, as shown in FIG. 6A. First material layer 51 is formed of electrically insulating layer 20. Second material layer 55 is injected from second injection nozzle 56, into first material layer 51, as shown in FIG. 5B. Second material layer 55 is formed of electrically conductive layer 22. Second material layer 55 is surrounded by first material layer 51 to form a concentric polymeric melt 57. Concentric polymeric melt 57 of first material layer 51 and second material layer 55 is continuously injected until mold cavity 54 is filled. Thereafter, mold cavity 54 is filled with a small amount of first material layer 51 from first injection nozzle 52 for completely surrounding second material layer 55, as shown in FIG. 5C. A suitable co-injection molding machine is available commercially from Engel Canada Inc., Guelph, Ontario, Canada and Battenfeld of America, Inc., West Warwick, Rhode Island and Cincinnati Milacron Plastics Technology Group, Batavia, Ohio.

Conditions required for injecting electrically insulating material layer 20 and electrically conductive material layer 22 into the mold cavity in either a multi-shot injection molding process or a co-injection molding process depend on the temperatures and viscosities of such materials and are well known to those skilled in the art. Typically, co-injection molding of a multi-layered article is favored by using polymeric materials with similar melt temperatures (within about 100° F.) and viscosities (within about 10 Pa-sec). It is also important that the two polymeric materials adhere to each other at their mutual interface. Adhesion is favored by using polymeric materials having similar compositions for forming the first material layer and the second material layer. For example, if the polymeric material used to form the first material layer is polycarbonate, then adhesion between the first material layer and the second material layer is favored if the second material layer is also polycarbonate.

Figure 6:
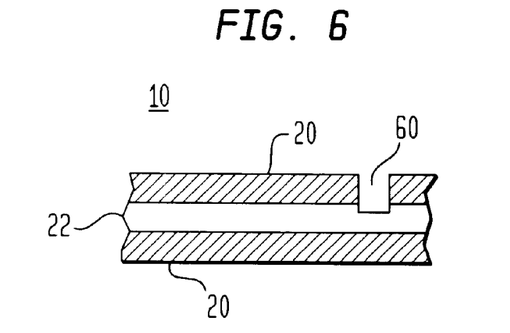
FIG. 6 is an enlarged cross section of the molded article shown in FIG. 2 including an opening in the first material layer.

Opening 60 can be formed in electrically insulating material layer 20 to provide access to electrically conductive material layer 22, as shown in FIG. 6. Opening 60 can be formed by spot facing or drilling through electrical insulation material layer 20. An electronic device housed by the molded circuit can access electrically conductive material layer 22 through opening 60.

Figure 7A:
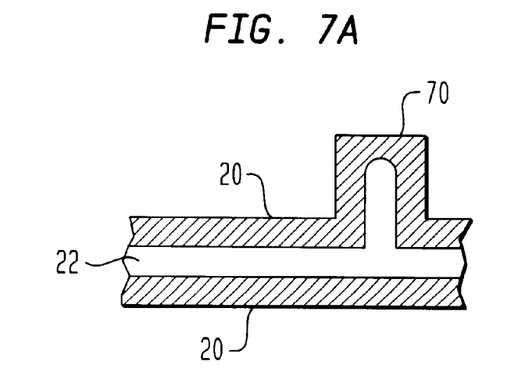
FIG. 7A is an enlarged cross section of the molded article shown in FIG. 2 including a protrusion on the first material layer.
Figure 7B:
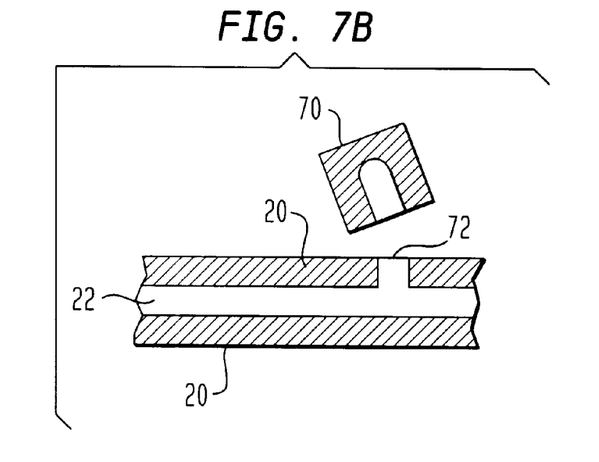
FIG. 7B is an enlarged cross section of the molded article shown in FIG. 7A including an opening in the protrusion.

Alternatively, protrusion 70 can be molded in electrically insulating material layer 20, as shown in FIG. 7A. Protrusion 70 is cut or broken to access electrically conductive material layer 22 through opening 72, as shown in FIG. 7B.

Figure 8A:
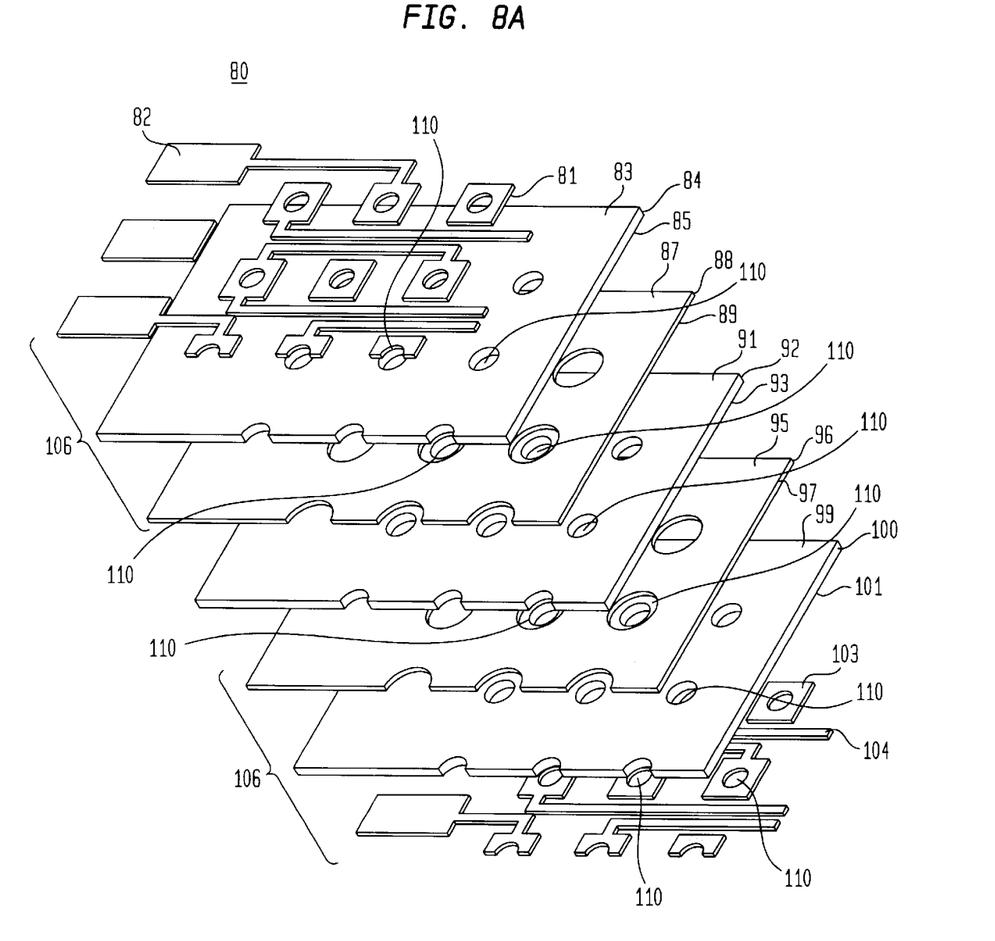
FIG. 8A is an exploded perspective view of an article comprising the molded circuit of the present invention having a multi-layered structure.
Figure 8B:
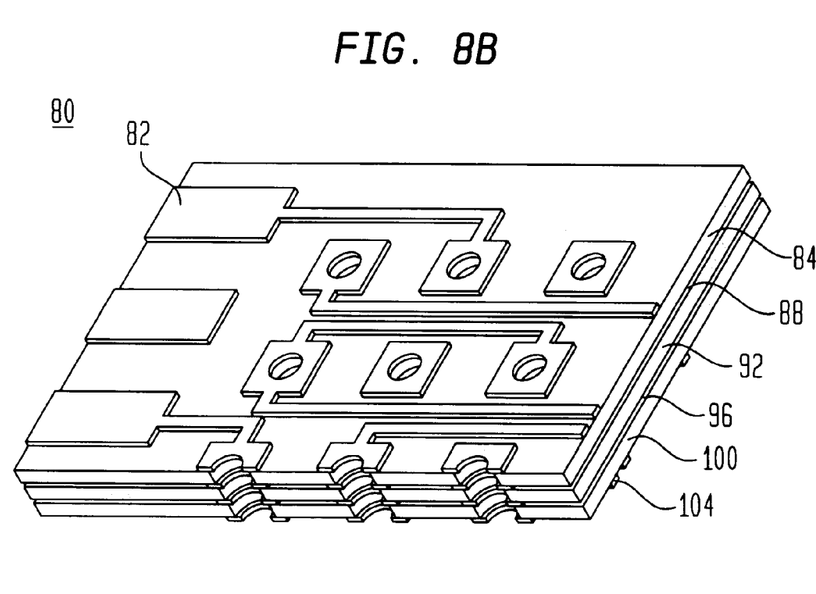
FIG. 8B is a perspective view of the article shown in FIG. 8A.

FIGS. 8A–8B illustrate an article 80 comprising molded circuit 10. Article 80 is a printed circuit board. Article 80 is a multi-layered structure including a first signal line interconnection layer 82, power plane layer 88, ground plane layer 96, and second signal line interconnection layer 104. First signal line interconnection layer 82, power plane layer 88, ground plane layer 96 and second signal line interconnection layer 104 are formed of electrically conductive material layer 22. First insulation layer 84, second insulation layer 92 and third insulation layer 100 are respectively molded between each of the electrically conductive layers. First insulation layer 84, second insulation layer 92 and third insulation layer 100 are formed of electrically insulating material layer 20.

Surface 83 of first insulation layer 84 is molded to surface 81 of first signal line interconnection layer 82. Surface 87 of power plane layer 88 is molded to surface 85 of first insulation layer 84. Surface 91 of second insulation layer 92 is molded to surface 89 of power plane layer 88. Surface 93 of second insulation layer 92 is molded to surface 95 of ground plane layer 96. Surface 97 of ground plane layer 96 is molded to surface 99 of third insulation layer 100. Surface 101 of third insulation layer 100 is molded to surface 103 of second signal line interconnection layer 104.

For example, first signal line interconnection layer 82, first insulation layer 84 and power plane layer 88 are molded in a three-shot injection molding process to form a first molded substrate 106. Ground plane layer 96, third insulation layer 100 and second signal line interconnection layer 104 are molded in a three-shot molding process to form second molded substrate 108. First molded substrate 106 and second molded substrate 108 are molded to second insulation layer 92 in an injection molding process. Electrically conductive material layer 22 flows through holes 110 to connect first signal interconnection layer 84, power plane layer 88, ground plane layer 96 and second signal interconnection layer 104 with electrically conductive material. Alternatively, the multi-layered structure of printed circuit board 80 can be formed by molding various combinations of the above-described material layers in various combinations of multi-shot processes, such as two-shot injection molding and three-shot injection molding.

The following examples will serve to further typify the nature of this invention but should not be construed as a limitation in the scope thereof, which scope is defined solely by the appended claims.

EXAMPLE 1

Injection molded spiral samples were molded using electrically conductive thermoplastic polymeric materials. The spiral samples provide long and narrow lengths of electrically conductive thermoplastic polymeric materials and are useful representations of electrical circuit elements such as signal lines. The spiral samples were formed having a 0.125×0.200 inch cross section and a length of about 40 inches compactly coiled into a spiral.

A polycarbonate (PC) thermoplastic polymeric material was obtained from Bayer Corporation, Polymers Division in Pittsburgh, Pennsylvania under trade name of Makrolon 6455. Metal coated graphite fibers were obtained from Composite Materials L.L.C., Mamaroneck, N.Y. under the trade name of Compmat. The metal-coated graphite fibers had a 7 $\mu$m diameter graphite fiber core which was first plated with a thin layer of nickel, followed by a 40% by weight of a copper layer, and completed with a flash layer of nickel of the graphite fiber (designated NiCuNi coated) to provide protection from oxidation of the copper layer. The metal-coated graphite fibers were bundled into rovings of 12,000 and bound together with a resin binder in a ratio of 75% by weight metal-coated graphite fibers and 25% by weight binder and were cut to a desired length pellet size of 0.250 inch. The metal-coated graphite fiber pellets were dry-blended into the polycarbonate thermoplastic polymeric material in amounts of about 6%, 8%, 10%, 12% and 14% by weight of the resin. The dry-blended mixtures were injection molded into a mold cavity to form a spiral sample at a temperature of about 500° F. and a pressure of about 20,000 psi.

Electrical resistance measurements along the length of the spiral flow samples of electrically conductive material were determined. Small holes were drilled through the spiral flow samples at inch increments along its length. Screws were driven into the holes through the molded electrical conductive material forming electrical contact to metal-coated graphite fibers within the spiral flow samples. Electrical resistance measurements were made from a screw at the center of the spiral flow sample to each successive screw along the length of the sample and between adjacent screws at one inch increments. The resistance was measured using a digital multi-meter. Resistance (R) is related to conductivity (C) as R=1/C.

Figure 9:
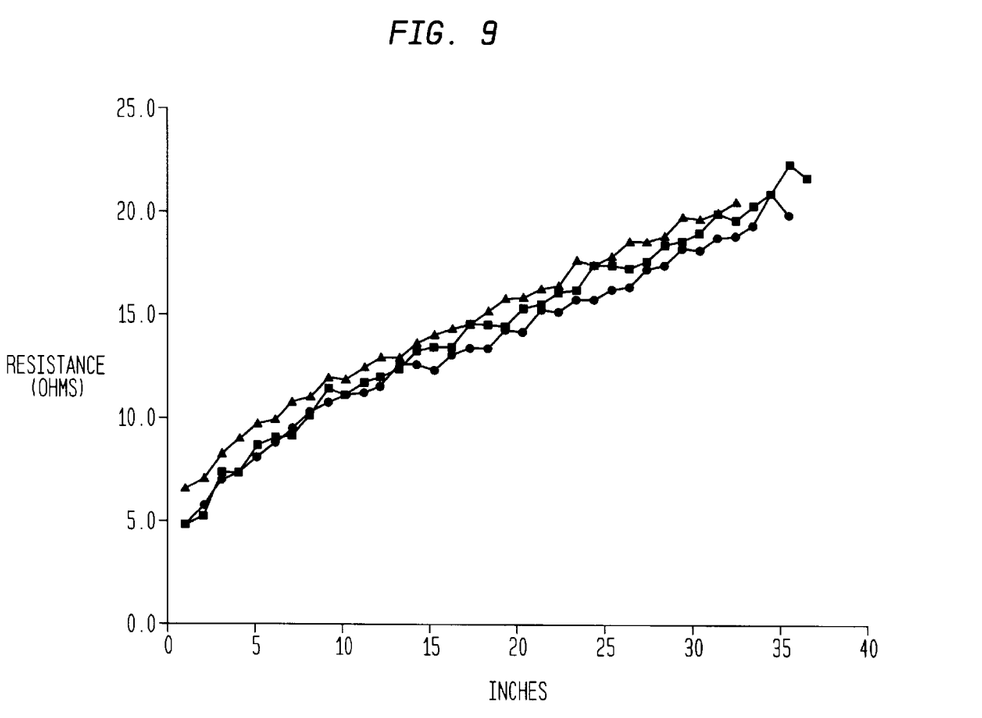
FIG. 9 is a graph of the resistance of a 12% of nickel-copper-nickel coated graphite additive suspended in polycarbonate plotted as a function of distance along a spiral sample.

FIG. 9 is a graph of the electrical resistance plotted as a function of length from the center of three spiral flow samples formed of 12% weight percent nickel-copper-nickel (NiCuNi) coated graphite fibers. As shown on the plot of FIG. 9, a 12% by weight NiCuNi-coated graphite fibers added to a polycarbonate polymeric material provides resistance along a length of 40 inches of less than 25.0 ohms and provides less than 5.0 ohms at a length of 1 inch which resistance is sufficient to provide electrical conductance in polycarbonate. The low value and linearity of the resistance curves over a 40 inch length indicates that the electrical conductive layer is useful as an electrical conductor. The linearity of the curves indicates uniform distribution of the metal-coated graphite fibers throughout the entire length of the spiral flow samples.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. A molded circuit comprising:

at least a first thermoplastic polymeric material layer and a second thermoplastic polymeric material layer;

said first thermoplastic polymeric material layer is an electrically insulating material having a volume resistivity of greater than about $10^{13}$ ohm-centimeter; and said second thermoplastic polymeric material layer is an electrically conductive material having a volume resistivity of less than about 2.0 ohm-centimeter, said second thermoplastic polymeric material layer has a composition in which conductive fibers are suspended within a thermoplastic polymeric material, said conductive fibers are present in an amount of at least about 6% by weight and no greater than about 25% by weight of said thermoplastic polymeric material and said fibers have an aspect ratio in the range of about 100:1 to about 2000:1, wherein said second thermoplastic polymeric material layer provides a path for an electrical current in said molded circuit.

2. The molded circuit of claim 1 wherein said first thermoplastic polymeric material layer has a surface resistivity of greater than about $10^{12}$ ohms/square and said second thermoplastic polymeric material has a surface resistivity of less than about 10 ohms/square.

3. The molded circuit of claim 1 further comprising:

a third thermoplastic polymeric material layer, said third thermoplastic polymeric material layer is formed of an electrically insulating material having a volume resistivity within the range of said first thermoplastic polymeric material layer and wherein said second thermoplastic polymeric material layer is sandwiched between said first thermoplastic polymeric material layer and said third thermoplastic polymeric material layer.

4. The molded circuit of claim 3 wherein said first thermoplastic polymeric material layer or said third thermoplastic polymeric material layer has an opening to provide access to said second thermoplastic polymeric material layer.

5. The molded circuit of claim 1 wherein said first thermoplastic polymeric material layer is selected from the group consisting of acrylonitrile-butadiene styrene (ABS), polycarbonate (PC), PC/ABS blends, polyamide nylon (PA), polyether imide (PEI), polyphenylene sulfide (PPS), polyvinylacetate (PVA), polyethylene (PE), polypropylene (PP), polyvinylchloride (PVC) and polyvinylpyrolidone (PVP).

6. The molded circuit of claim 1 wherein said conductive fibers have an aspect ratio in the range of about 780:1 to about 820:1 and said conductive fibers are present in an amount of about 10% to about 20% by weight of said thermoplastic polymeric material.

7. The molded circuit of claim 1 wherein said thermoplastic polymeric material of said second thermoplastic material layer is selected from the group consisting of acrylonitrile-butadiene styrene (ABS), polycarbonate (PC), PC/ABS blends, polyamide nylon (PA), polyether imide (PEI), polyphenylene sulfide (PPS), polyvinylacetate (PVA), polyethylene (PE), polypropylene (PP), polyvinylchloride (PVC) and polyvinylpyrolidone (PVP).

8. The molded circuit of claim 1 wherein said conductive fibers are selected from the group consisting of nickel-coated graphite (NiCG), nickel copper-coated graphite (NiCuCG) fibers, nickel copper nickel-coated graphite (NiCuNiCG) fibers, nickel-coated copper (NiCCu) fibers, stainless steel (SS) fibers, and copper plated stainless steel (CuCSS) fibers.

9. The molded circuit of claim 1 wherein the molded circuit is formed using co-injection molding.

10. The molded circuit of claim 1 wherein the molded circuit is formed using multi-shot injection molding.

11. The molded circuit of claim 1 wherein said second thermoplastic polymeric material layer is a ground plane layer.

12. The molded circuit of claim 1 wherein said second thermoplastic polymeric material layer is a power plane layer.

13. The molded circuit of claim 1 wherein said second thermoplastic polymeric material layer is a signal line interconnection layer.

14. An article comprising the molded circuit of claim 1.

15. The article of claim 14 wherein said article forms a printed circuit board.

16. The article of claim 15 further comprising a plurality of said second thermoplastic polymeric material layers and a plurality of said first thermoplastic polymeric material layers wherein:

a first of said second thermoplastic polymeric material layers is a first signal line interconnection layer;

a second of said second thermoplastic polymeric material layers is a power plane layer;

a third of said second thermoplastic polymeric material layers is a ground plane layer;

a fourth of said second thermoplastic polymeric material layers is a second signal line interconnection layer; and each of said plurality of first thermoplastic polymeric material layers is molded between adjacent ones of said plurality of second thermoplastic polymeric material layers.

17. The article of claim 16 wherein said first signal line interconnection layer is connected to said second signal line interconnection layer with said second thermoplastic polymeric material.

18. A molded circuit comprising:

at least a first thermoplastic polymeric material layer and a second thermoplastic polymeric material layer;

said first thermoplastic polymeric material layer is an electrically insulating material having a volume resistivity of greater than about $10^{13}$ ohm-centimeter; and said second thermoplastic polymeric material layer is an electrically conductive material having a volume resistivity of less than about 2.0 ohm-centimeter, wherein said second thermoplastic polymeric material layer provides a path for an electrical current in said molded circuit and is formed using multi-shot injection molding.

* * * * *